United States Patent [19]

Drumm

[11] Patent Number: 5,761,079
[45] Date of Patent: Jun. 2, 1998

[54] ENGINEERING CHANGE MANAGEMENT SYSTEM EMPLOYING A SMART EDITOR

[75] Inventor: Anthony DeGroff Drumm, Rochester, Minn.

[73] Assignee: International Business Machines Corporation, Armonk, N.Y.

[21] Appl. No.: 903,045

[22] Filed: Jul. 30, 1997

Related U.S. Application Data

[63] Continuation of Ser. No. 15,401, Feb. 9, 1993, abandoned.

[51] Int. Cl.⁶ ................................. G06F 17/50
[52] U.S. Cl. .................. 364/489; 364/578; 395/707; 395/708
[58] Field of Search ................ 395/704, 705, 395/706, 707, 708, 709; 364/488, 489, 490, 578

[56] References Cited

U.S. PATENT DOCUMENTS

| | | | |
|---|---|---|---|
| 4,533,997 | 8/1985 | Furgerson | 364/200 |
| 4,553,997 | 11/1985 | Furgerson | 364/200 |
| 4,558,413 | 12/1985 | Schmidt et al. | 364/300 |
| 4,831,543 | 5/1989 | Mastellone | 364/489 |
| 4,882,690 | 11/1989 | Shinsha et al. | 364/490 |
| 4,891,766 | 1/1990 | Derr et al. | 364/513 |
| 4,942,536 | 7/1990 | Watanabe et al. | 364/490 |
| 5,041,992 | 8/1991 | Cunningham et al. | 364/518 |
| 5,191,541 | 3/1993 | Landman et al. | 364/489 |
| 5,220,512 | 6/1993 | Watkins et al. | 364/489 |
| 5,231,590 | 7/1993 | Kumar et al. | 364/491 |
| 5,249,133 | 9/1993 | Batra | 364/489 |
| 5,325,309 | 6/1994 | Halaviati et al. | 364/488 |

OTHER PUBLICATIONS

Johnson, R et al., "The RTL System: A Framework for Code Optimization", Code Generation—Concepts, Tools, Techniques, Proceedings of the International Workshop, pp. 255-274 May. 1991.

"Transform System For Boolean Comparison", IBM Technical Disclosure Bulletin, vol. 32, No. 10A, Mar. 1990, pp. 148-150.

"Fully Self-Contained Memory Card Extended Error Checking/Correcting Hardware Implementation" by Weaver et, IBM Tech. Discl. Bltin. vol. 31, No. 5, 1990, pp. 352-355.

Boolean Comparison of Hardware and Flowcharts, by Smith et al, IBM Journal Res. Develop., vol. 26, No. 1, (1982), pp. 106-116.

"An Execution—Backtracking Approach to Debugging" by Agrawal, H. et al., IEEE Software, May 1991, vol. 8, Iss. 3, pp. 21-26.

"On Real–Time Software Testing and Debugging" by Tsai, J. et al, Computer Software and Applications Conference 1990 COMPSAC, pp. 512-518, Jul. 1990.

Jones, L., "Fast Batch and Incremental Netlist Compilation of Hierarchical Schematics", IEEE Transactions on Computer–Aided Design, vol. 10, No. 7, Jul. 1991, pp. 922-931.

Jennings, G., "A Case against Event–Driven Simulation for Digital System Design", IEEE Comput. Soc. Press, Proceedings of the 24th Annual Simulation Symposium, Apr., 1991, pp. 170-176.

Ooi, T. et al, "Netlist compiler for ASIC design on a personal computer", Computer–Aided Engineering Journal vol. 8, Iss. 5, Oct. 1991, pp. 200-204.

Beetem, J. et al "Incremental Scanning and Parsing With Galaxy", IEEE Transactions On Software Engineering, vol. 17, No. 7, Jul. 1991, pp. 641-651.

*Primary Examiner*—Emanuel T. Voeltz
*Assistant Examiner*—Michael T. Richey
*Attorney, Agent, or Firm*—Baker, Maxham, Jester & Meador

[57] ABSTRACT

A system for identifying and bounding the regions of a digital electronic logic design model that are affected by design revisions. The system is useful for improving the efficiency of incremental logic synthesis systems and includes procedures for recording the signals directly affected by user revision operations and for marking signals in the logic to identify those indirectly affected. A smart editor capable of parsing the formal register transfer language (RTL) in which the logic design is described is included in the system.

7 Claims, 1 Drawing Sheet

ENGINEERING CHANGE MANAGEMENT SYSTEM EMPLOYING A SMART EDITOR

This application is a continuation of application No. 08/015,401, filed Feb. 9, 1993, now abandoned.

BACKGROUND OF THE INVENTION

1. Field of the Invention

This invention relates to the computer-aided design of digital electronic systems, and more specifically to the computer-aided management of engineering changes to such system designs through use of a smart editor.

2. Discussion of the Related Art

In the later stages of the design process for a digital electronic system, every change in the system's logic may require repetition of several technology-oriented design processes. Each of these design processes may consume large amounts of human effort and machine resources. Such processes include logic synthesis, circuit layout, conductor routing and logic verification.

There are many ways to describe a digital logic design model. The level of description has become more abstract as practitioners in the art increasingly turn to computer-assisted circuit design tools known in the art, such as logic synthesis. Such tools can automatically form a low-level, technology-dependent description of a circuit design from a higher-level, technology-independent description. The higher-level design model ($M_1$) is typically represented as a graphical logic diagram, a truth table or a register transfer language (RTL) listing.

Truth tables tend to be limited in scope and capability and are not particularly useful for describing large designs.

The graphical representation most nearly conforms to the circuit design form traditionally used in the art; that is, graphical drawings of logic gates and data flow paths on paper. Therefore, practitioners in the art have steadily improved the automation and user interface technology for computerized graphics entry systems.

RTL representations of logic design models are a fairly recent development. Many practitioners in the electronics design art have been reluctant to embrace the RTL notion, which is readily accepted by practitioners in the computer software arts. Most practitioners have concentrated on producing efficient low-level technology-dependent design model ($M_2$) descriptions that meet the circuit design requirements through logic synthesis. A few practitioners have accepted simple text editors as useful tools for manipulating the RTL representations of digital logic circuit design models.

Recent advances in logic synthesis technology have made the use of RTL logic descriptions much more advantageous. However, the simplest RTL descriptions are too limited to handle all of the information necessary to the logic synthesis process. For example, logic synthesis may require circuit timing information not included in the RTL listings. Such timing constraints must be independently presented to the logic synthesis system, either by adding extensions to the RTL listings or through associating auxiliary files with the RTL listing.

Adding extensions to the RTL entries offers the advantage of neatly encapsulating all pertinent information into one file; the RTL listing describing the circuit design model. The user then need only edit that listing to examine and alter the design model. Disadvantageously, this approach complicates the RTL description of the logical functions by including data not related directly to that logical function. Also, if the technology-specific ($M_2$) implementation criteria change, the RTL extension data may also change without any change in logical function. Moreover, a small change in a single parameter may require a full recompilation of the RTL description because the RTL listing is textual and must be parsed into a form useable by an automated apparatus.

Associating auxiliary data files with the RTL model description avoids this disadvantage but complicates the data management chore because any change to the logical function must also be reflected in the auxiliary data and vice-versa. There are also many opportunities for error arising from independent file modification and versioning operations. Neither the incorporation of RTL extensions or the association of auxiliary data files does much to improve the productivity of the logic design practitioner.

Notwithstanding these problems, a typical technology-independent description ($M_1$) model of the Boolean functions at the register-transfer level (RTL) can be used in a logic synthesis system to generate a detailed technology-level description ($M_2$) model for the same circuit design. The $M_2$ technology-level description usually is also expressed as a list of textual statements.

Changes in a design are made during circuit development for many reasons. During the early stages, the logic design $M_2$ model may be constructed in steps so that changes represent new functions. As a design approaches completion, changes are more often required to fix problems detected during simulation or timing analysis. As changes are made to the design, certain design procedures must be repeated, depending on when such changes are made. For instance, changes made to a RTL listing of a technology-independent $M_1$ model must be reprocessed by a logic synthesis system to effect corresponding changes to the technology-dependent $M_2$ model. Accordingly, the practitioner may find it advantageous to design in increments using incremental logic synthesis methods recently introduced in the art.

Incremental synthesis systems are useful for automatically resynthesizing a new version of an electronic design based on knowledge of the exact circuit areas affected by change. Shinsha, et al disclose a rudimentary incremental system in U.S. Pat. No. 4,882,690. An improved incremental synthesis system is disclosed by Drumm in a copending patent application entitled "Incremental Logic Synthesis System For Efficient Revision Of Logic Circuit Designs" U.S. Pat. No. 5,436,849, issued Jul. 25, 1995 and entirely incorporated herein by this reference. All such systems require some useful and efficient method for identifying which areas are to be changed and may require substantial computer resources to do so.

Changes made to a technology-dependent $M_2$ model may be either functional or non-functional. Functional changes may require updating not only the technology-dependent $M_2$ model but also the RTL listing of the independent $M_1$ model describing the circuit design. This is often done because simulation performance can be enhanced by using a higher-level simulation model than the technology-dependent $M_2$ model. In such cases, additional functional verification is also needed to ensure that the changes made to both the $M_1$ model and the $M_2$ model are identical. Non-functional changes may be necessary to fix problems such as those found during timing analysis and these too must be verified against the original circuit description to ensure no unwanted changes in logical function.

The incremental logic synthesis procedure improves the efficiency of these verification procedures through limiting the number of circuit elements involved in the change and verification operations. However, as discussed in the above-cited Drumm reference, incremental logic synthesis requires some mechanism to fully identify the region within the circuit design description that contains the change.

This identification mechanism can use any of the Boolean static verification tools known in the art for validating non-functional changes. Disadvantageously, when Boolean verification is used, it is usually applied to an entire logic model, regardless of the extent of changes made to the model. This may be an acceptable burden for the first equivalence test performed between an $M_1$ model description and its resulting $M_2$ model description. Such global verification may also be acceptable for a single final verification performed just before actual fabrication of the circuit. However, these global Boolean comparisons are very time-consuming, both in terms of computer resources and development turn-around time. If the change is small, most of the verification resources are wasted because most of the logic is unchanged.

There is accordingly a need in the art for an efficient automated method for identifying the pieces of an RTL design $M_1$ model affected by a design change. Such method should economically bound the changed portion for use in an incremental logic synthesis procedure for synthesizing the corresponding technology-dependent ($M_2$) circuit design.

Practitioners have proposed solutions for limiting the areas of changes in other data objects. For instance, in U.S. Pat. No. 4,533,997, Donald F. Furgerson discloses a monitored system that may be reconfigured on-line. Furgerson's system maintains reference tables relating object code to the source. However, in Furgerson's system, the source itself is not available and changes are made using reverse compiling without a tracking and management system. The code is removed, decompiled, revised, and then replaced: that is, there remains a distinct preset boundary around the change and the entire affected module is replaced. Furgerson neither teaches nor suggests a method for dynamically adjusting the size of the affected module to minimize the replaced portion.

Recent improvements in the text editing art have made language entry faster and easier. For instance, a syntax-directed editor such as disclosed in the Editor User's Guide (Cooperative Editor Systems Library, "The Editor User's Guide" (1989)), performs rudimentary parsing of incoming data and recognizes certain textual constructs. Upon encountering particular constructs, the syntax-directed editor may automatically add a template, which the user then completes. Also, more sophisticated parsing editors can alter the view of the incoming textual information for easier critical review by the user. Although these advances offer some productivity advantages to the logic design practitioner using RTL design representations, the sophisticated editor by itself offers no relief from the above-described data management problems.

In U.S. Pat. No. 4,891,766, Andrew G. Derr, et al disclose an editor for expert systems that is context-sensitive. Their editor can recognize some portions of the information being edited. Thus, Derr, et al teach another editor that may be useful in implementing a solution to the logical comparison problem discussed above for RTL textual listings.

A "smart" editor alone does not solve the problem of excessive Boolean comparison operations following changes to the RTL description of the technology-independent $M_1$ model. The related unresolved problems and deficiencies are clearly felt in the art and are solved by this invention in the manner described below.

SUMMARY OF THE INVENTION

The system of this invention solves the above problem by introducing a new combination of three procedures. The first procedure of this invention employs a "smart" editor, either graphical or text-based, to maintain a list of design objects that have been changed during a single editing session. For instance, a parsing editor such as LPEX (IBM United Kingdom Laboratories Limited, "OS/2 Live Parsing Editor (LPEX)-User's Guide", Chapters 1 and 6, (1989)) is adapted to edit the RTL listings representing the circuit design models discussed above.

Combining three-dimensional editing techniques with a parsing editor enables the resulting "smart editor" to perform rudimentary parsing of the RTL listing while simultaneously maintaining lists of identifiers including identifiers reserved by the RTL and identifiers defined by the user. Auxiliary data stored outside the RTL list is cross-associated by the smart editor through such user-defined identifiers. The smart editor thus performs the non-logical circuit data management functions required to track changes to timing requirements and the like, eliminating "versioning" errors. This related data is available to the user through the smart editor interface without encumbering the RTL listing with information not related to logic functions.

Simple presentation techniques are used to distinguish user-defined identifiers from those reserved by the RTL and to distinguish identifiers having associated data from those identifiers without associated data. The first procedure of this invention employs the smart editor to globally track and store all logic changes made by the user in text-linked format compatible with RTL listings describing the $M_1$ model.

The second procedure of this invention processes the list of design objects to minimize and isolate the sections of the technology-independent $M_1$ model that contain the changing logic.

The third procedure of this invention employs data transfer means to transfer a description of these changed logic sections to an outside object. The outside object is either an incremental logic synthesis system or a Boolean comparison function. For an outside incremental logic synthesis system, the initial Boolean comparison operation is unnecessary with this invention. For an outside Boolean comparison function, only the changed logic need be compared with this invention.

From the list of all signals affected by all user edit commands in a cumulative editing session, the system of this invention marks the signals as "changed". In the $M_1$ model, the outputs from every digital logic function (component) having one or more marked input is also marked. The marking process continues iteratively until no new marks are made. The marked signals identify and bound the circuit design model region containing the editing session changes.

"Smart" editors are known in the art that are useful for maintaining design files for electronic systems by "preprocessing" each user edit command to verify syntax and initiate other activities. The automatic editor activity must include writing into a buffer or file the name of the signal or signals directly affected by such an edit in accordance with the method of this invention.

In a further aspect of the invention, other automatic operations may be performed after the marking procedure, such as comparing the old and new Boolean versions of marked output signals and immediately informing the user of the comparison result. Such automatic operations are helpful to the designer if they are performed rapidly without undue computer resources.

The foregoing, together with other objects, features and advantages of this invention, will become more apparent when referring to the following specification, claims and the accompanying drawing.

BRIEF DESCRIPTION OF THE DRAWINGS

For a more complete understanding of this invention, reference is now made to the following detailed description of the embodiments as illustrated in the accompanying drawing, wherein.

DETAILED DESCRIPTION OF THE PREFERRED EMBODIMENTS

Figure 1:
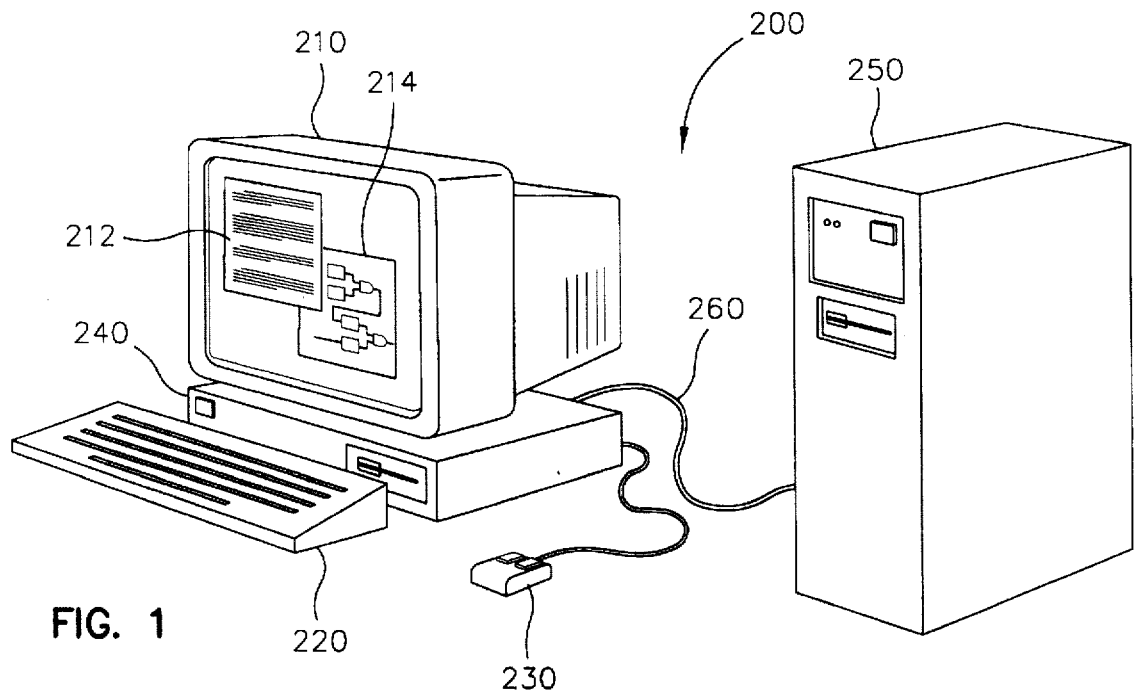
FIG. 1 shows a typical computer system in which this invention would be practiced.

The system of this invention can be embodied as the computer system shown in FIG. 1. The user employs a computer 200 having a large screen 210; a keyboard 220; preferably a pointing device 230; and a system unit 240. Computer 200 is preferably connected to a file server 250 via data communications hardware 260 to permit sharing of design files and information between different users. The user (not shown) edits design files using programs that operate on a representation of the design file either as RTL text 212 or as graphics 214.

Figure 2:
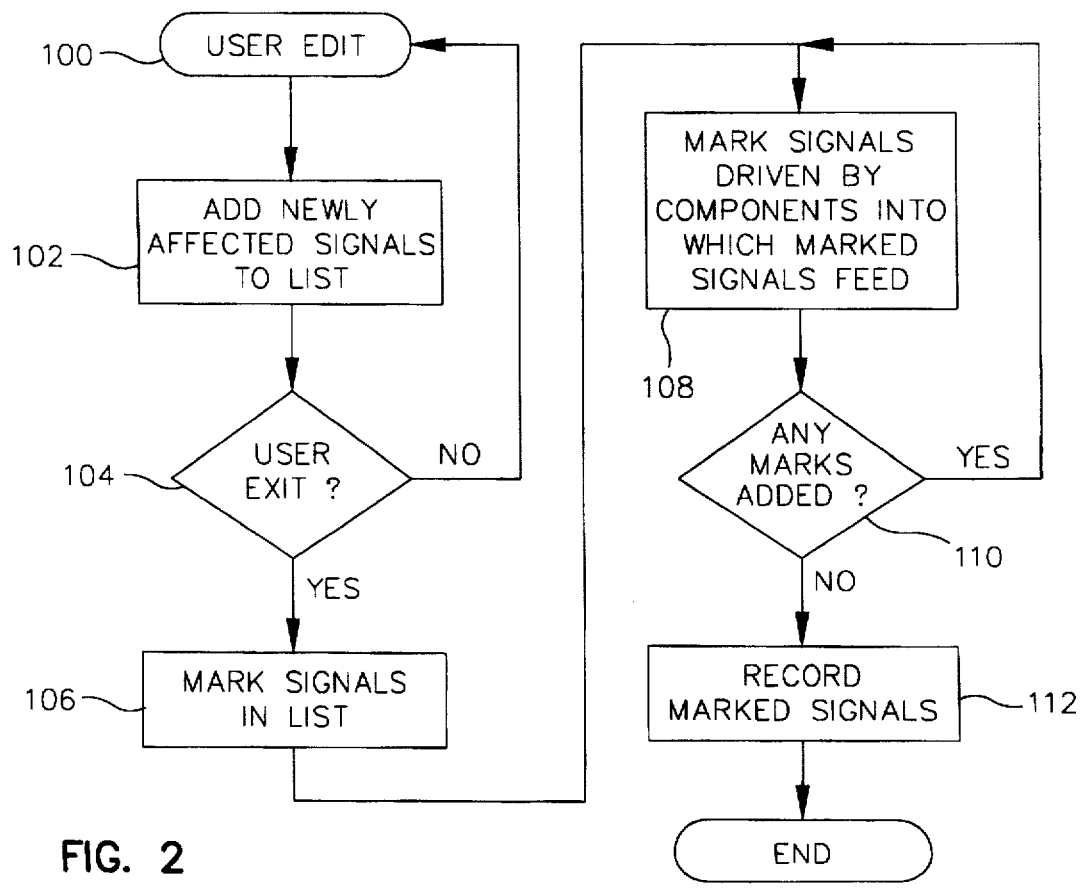
FIG. 2 is a flowchart of the method of this invention.

FIG. 2 shows the flow of steps in the method of this invention. Following each user revision of a logical design file, the signals affected by the edit are identified, added to a list and logically marked in the design file.

A "user edit" or "user revision" herein denominates a single low-level revision, such as making changes to one line in a text file. The signal identification process can be done less frequently; for example, whenever the user commands a file save operation. But this is not preferred because the otherwise simple signal identification operation then requires a complex operation similar to a comparison of the old and new versions of the design file.

A smart editor such as discussed above or any editor with a parsing capability can maintain a list of user-defined signals in step 102 following each user edit step 100 in FIG. 2. Any statement in the design language may effect the value of one or more signals. For example, a signal assignment statement such as SIGNAL1<=X and Y and Z references four signals; X, Y, Z, and SIGNAL1. Of these signals, only the value of SIGNAL1 is "affected" by this statement.

Using parsing capability, the smart editor determines which statement is being changed by the user edit step 100 and, consequently, which signals may be affected by the change. A list of such signals whose values may have been changed is amended by the editor at step 102. Obviously, a more sophisticated editor can determine whether a given change really affects the corresponding signal or whether a subsequent change cancels an earlier one. Such sophistication can enhance the system of this invention but the simple capability to perform step 102 provides the most significant benefit with minimal additional computer resources.

A graphics-based editor used for schematic capture, for example, can also maintain a similar change list. However, graphics editors operate with objects such as boxes and signals, which makes the features represented by step 102 much simpler to implement.

After a set of changes has been made, the system of this invention exits at step 104, completing the single change session. The second change procedure of this invention is then given a directed acyclic graph of the logic model generated from the text or graphics description of the logic function. The change procedure is also given the list of signals that may have been changed. With this list, the affected signals are identified and marked in the graph at step 106. A forward trace procedure is conducted through the graph from each of the marked signals through the outputs of the combinatorial logic. The term "output" as used herein denominates any stable point or node designated as usable for testing the equivalence of two associated logic models. Commonly used equivalence nodes are the primary outputs of the logic model, the inputs to memory elements, and other nodes marked in such a way that logic synthesis can guarantee the existence of those nodes in its output model. Any useful tracing procedure known in the art may be used with the system of this invention at steps 108 and 110.

The set of combinatorial logic outputs marked by the forward trace procedure is the set that may have been affected by the initial set of changes. It is these nodes that may no longer be equivalent to their corresponding nodes in the earlier unchanged logic model. These marked outputs are recorded at step 112 in FIG. 2. All other combinatorial logic outputs are necessarily unchanged and must therefore be equivalent to their corresponding nodes in the earlier unchanged logic model. Thus, a test for equivalence at these unmarked nodes is not necessary and represents a waste of processing resources.

Although not preferred, if sufficient computational power is available to the user, the above-described procedures can be simultaneously and interactively executed to provide true user interaction with the logic model. For example, the model graph can be maintained and incrementally updated as changes are made by the user and a copy of the initial unchanged graph may also be maintained. Every change made by the user is then immediately reflected in the graph as the smart editor identifies the affected signals. When an affected combinatorial logic node is identified, it is presented to a Boolean comparison function and a comparison made between the earlier and later graphs. If the Boolean comparison produces any miscompares, these then are immediately communicated to the user interactively.

The exact method for identifying the signals affected by a user revision depends on the structure of the design file. Example 1 below lists a typical textual design file expressed in the widely-used hardware description language VHDL. VHDL is defined herein as a formal language of a type for which parsers are well-known in the art. A user revision of this file could consist, for example, of changing the first assignment statement in the file from "X1(<=SYND(11) xor SYND(12)" to "X1(1)<=SYND(11) and SYND(12)". By parsing this changed line using a conventional formal language parser, the smart editor discovers that signal X1(1), being found on the left-hand side of the assignment statement, has potentially been affected by the change.

In a further refinement, rather than simply looking to what signals are in the left-hand side of assignments, the smart editor compares the right-hand sides of the old and new versions of such statements to identify logical differences. However, the benefits of such a refinement probably do not justify the additional computational cost.

The following example 1 is a VDHL description of a simple technology-independent $M_1$ design model.

EXAMPLE 1

A Typical Textual Design File entity TRAN is
    port(signal SYND : in BIT_VECTOR(1 to 16);

signal ODDSYND: out BIT;
signal DATAOUT out BIT_VECTOR(1 to 16);
end TRAN;
architecture DATA_FLOW of TRAN is
   signal X1,X2,X3,X4,X5,X6,X7,X8,X9,X10,X11,X12,
      X13, X14,X15,X16,SYNDODD : BIT;
   signal TSYND: BIT_VECTOR(1 to 16);
begin
X1(1)<=SYND(11) xor SYND(12);
X2(1)<=SYND(5) xor SYND(9);
X3(1)<=SYND(7) xor SYND(13);
X4(1)<=SYND(6) xorX3(1);
X5(1)<=SYND(8) xor SYND(14);
X6(1)<=SYND(15) xor X5(1);
X7(1)<=SYND(3) xor X4(1);
X8(1)<=X6(1) xor X7(1);
X9(1)<=SYND(4) xor SYND(11);
X10(1)<=SYND(4) xor SYND(16);
X11(1)<=SYND(2) xor X2(1);
X12(1)<=SYND(10) xor X1(1);
X13(1)<=X11(1) xor X12(1);
X14(1)<=SYND(1) xor X10(1) xor X13(1);
X15(1)<=SYND(5) xor SYND(16);
X16(1)<=SYND(13) xor SYND(15) xor X15(1);
TSYND(L)<=SYND(1) xor SYND(12) xor X2(1) xor X3(1) xor X6(1);
TSYND(2)<=SYND(9) xor SYND(10) xor X6(1);
TSYND(3)<=SYND(5) xor SYND(7) xor X5(1) xor X12(1);
TSYND(4)<=SYND(14) xor X15(1) xor X4(1);
TSYND(5)<=SYND(16) xor X1(1) xor X11(1);
TSYND(6)<=SYND(6) xor X12(1);
TSYND(7)<=SYND(12) xor X7(1);
TSYND(8)<=X4(1) xorX5(1) xor X9(1);
TSYND(9)<=X3(1) xor X14(1);
TSYND(10)<=SYND(6) xor X16(1);
TSYND(11)<=SYND(4) xorX11(1) xorX8(1);
TSYND(12)<=SYND(2) xor SYND(3) xor SYND(11) xor X16(1);
TSYND(13)<=SYND(8) xor SYND(9) xor X9(1);
TSYND(14)<=SYND(9) xor X1(1) xor X5(1) xor X10(1) xor X7(1);
TSYND(15)<=SYND(2) xor SYND(10) xor SYND(14) xor X10(1);
TSYND(16)<=X13(1);
SYNDODD(1)<=X8(1) xor X14(1);
DATAOUT(1 to 16)<=TSYND(1 to 16);
ODDSYND(1)<=SYNDODD(1);
send DATA_FLOW;

This file was edited using an enhanced version of a syntax-directed editor of the type discussed hereinabove. The two lines:
X1(1)<=SYND(11) xor SYND(12);
X2(1)<=SYND(5) xor SYND(9);
were changed to read:
X1(1)<=SYND(11) and SYND(12);
X2(1)<=SYND(5) and SYND(9);

When this updated VHDL file is saved, the editor produces an auxiliary file listing the signals that are affected by the change. The new file contains the following lines:
X1
X2

The updated VHDL file is then compiled and a directed acyclic graph is formed to represent the logic model describe by the new VHDL. The system of this invention operates on this graph to perform the following steps:

1. Read the auxiliary file listing the changed signals.
2. Mark those signals that were changed.
3. Expand the vectored model (each signal may represent n bits) to a single bit model (each signal may represent only one bit), while simultaneously copying the marks from the previous step to all expanded signals representing the marked vectored signals.
4. Propagate the marks through the logic until reaching the combinatorial logic outputs. These may be primary output nodes of the model or the inputs to memory elements (e.g., registers).
5. Write a list of identifying information for all combinatorial logic outputs that are potentially affected by the change. This information is presumed to be stable through all design automation processes and is normally used for comparing two models for functional equivalence.

This process produced the following list for this example:
Changed net: "+DATAOUT(9)" Proto pin is "DATAOUT.8".
Changed net: "+ODDSYND(1)" Proto pin is "ODDSYND.0".
Changed net: "+DATAOUT(16)" Proto pin is "DATAOUT.15".
Changed net: "+DATAOUT(3)" Proto pin is "DATAOUT.2".
Changed net: "+DATAOUT(6)" Proto pin is "DATAOUT.5".
Changed net: "+DATAOUT (5)" Proto pin is "DATAOUT.4".
Changed net: "+DATAOUT(14)" Proto pin is "DATAOUT.13".
Changed net: "+DATAOUT(11)" Proto pin is "DATAOUT.10".
Changed net: "+DATAOUT(1)" Proto pin is "DATAOUT.0".
Number of end-points affected is 9.
There are 17 prototype output pins.
There are 0 register input pins.

The final three lines show the net benefit of the system of this invention for this example. The original $M_1$ model contains 17 combinatorial logic outputs (17 primary outputs and 0 register inputs). Normally, all such outputs would be tested when performing an operation such as comparing Boolean equivalence. However, in this case, only the nine signals listed require such testing because it is now known that only these nine signals can be affected by the changes made to the original $M_1$ model. Of course, the benefits are more substantial when small changes are made to larger designs.

In another embodiment of this invention, the design file is edited graphically. In such case, rather than affecting a line of text, a typical user revision might add or delete a component or signal, change the polarity of a signal, or change the set of components to which a signal connects. In these cases, the affected signal or signals are also readily identified and added to a suitable list.

If there are system or combinational logic outputs among the signals marked as affected by user revisions, a Boolean comparison procedure may be used to determine whether any of these outputs are different logical functions of the inputs in the old and new versions of the design. Such comparison may be useful if the user had the intention of changing no outputs or only certain outputs, because it provides a check to the user if other outputs have inadvertently been changed. Boolean comparison procedures include those are described by G. L. Smith, et al ("Boolean Comparison of Hardware and Flowcharts", IBM Journal of Research and Development, Vol. 26, No. 1, pp. 106–116 (1982)).

Clearly, other embodiments and modifications of this invention will occur readily to those of ordinary skill in the art in view of these teachings. Therefor, this invention is to be limited only by the following claims, which include all such embodiments and modifications when viewed in conjunction with above specification and the accompanying drawing.

I claim:

1. A method for identifying and bounding a portion of a digital electronic logic design having a plurality of input or output nodes, said portion being affected by a change to said logic design carried out by means of an editing procedure including one or more user edits, said digital electronic logic design having a plurality of logic signals mapped to or from one another or one or more said nodes, said method comprising the computer-executable steps of:

providing said digital electronic logic design in the form of a plurality of text lines in a resister transfer language (RTL), followed by:

(a) for each said user edit, identifying said logic signals that are directly affected by said each user edit and storing said affected signals in a list by:

(a.1) parsing said text lines affected by said each user edit to generate logical data, and (a.2) identifying said logic signals that are potentially affected by said user edit from said logical data;

(b) marking each said logic signal in said list;

(c) marking each said logic signal into which said each marked logic signal is mapped and storing said each newly marked logic signal in said list; and (d) repeating said marking step (c) for each said marked signal until no new marks are made in said marking step (c).

2. The method of claim 1, further comprising the step of:

(e) performing a Boolean comparison between an old version and a new version of said digital electronic logic design for all said nodes to or from which said marked signals are mapped.

3. The method of claim 1, further comprising the step of:

(f) verifying the accuracy of said bounded portion digital logic design portion by performing a Boolean comparison between the original version and the changed version of said digital logic design for all said input and output nodes to or from which said marked logic signals are mapped.

4. An editor for digital electronic system logic design files having a first plurality of mapped logic signals, said editor comprising:

a plurality of text lines in a register transfer language (RTL) that embody said digital electronic logic designs;

identification means for identifying said logic signals directly affected by a user edit operation;

the identification means including:

parser means for parsing said text lines affected by said each user edit to generate logical data, and second identification means for identifying said logic signals that are potentially affected by said user edit from said logical data.

storage means for storing said affected signals in a second list;

first marker means for marking each said logic signal in said second list; and second marker means for marking each said logic signal into which said each marked logic signal is mapped and for storing said each marked logic signal in said second list.

5. The editor of claim 4, further comprising:

comparison means for performing a Boolean comparison between an old version and a new version of said digital electronic logic design for all said nodes to or from which said marked signals are mapped.

6. The editor of claim 4, further comprising:

comparison means for verifying the accuracy of said bounded portion digital logic design portion by performing a Boolean comparison between the original version and the changed version of said digital logic design for all said input and output nodes to or from which said marked logic signals are mapped.

7. A computer software system having a set of computer-executable instructions for editing digital electronic system logic design files including a plurality of text lines in a register transfer language (RTL) that embody a design and for bounding a portion of said design that is affected by a design change, said design files having a first plurality of mapped logic signals, said software system comprising:

identification means for identifying said logic signals directly affected by a user edit operation;

the identification means including:

RTL parser means for parsing said text lines affected by said each user edit to generate logical data; and second identification means for identifying said logic signals that are potentially affected by said user edit from said logical data;

storage means for storing said affected signals in a second list;

first marker means for marking each said logic signal in said second list; and second marker means for marking each said logic signal into which said each marked logic signal is mapped and for storing said each marked logic signal in said second list.

* * * * *